United States Patent
Arndt et al.

(10) Patent No.: US 7,432,790 B2
(45) Date of Patent: Oct. 7, 2008

(54) SUPERCONDUCTOR ASSEMBLY

(75) Inventors: Thomas J. Arndt, Hanau (DE); Bernhard Fischer, Bruchkobel (DE); Martin Munz, Alzenau (DE); Andreas Szulczyk, Linsengericht (DE); Manfred Thoner, Biebergem.B (DE)

(73) Assignee: Vacuumschmelze GmbH & Co KG (DE)

( * ) Notice: Subject to any disclaimer, the term of this patent is extended or adjusted under 35 U.S.C. 154(b) by 62 days.

(21) Appl. No.: 10/474,103

(22) PCT Filed: Mar. 19, 2002

(86) PCT No.: PCT/EP02/03031

§ 371 (c)(1),
(2), (4) Date: Feb. 27, 2004

(87) PCT Pub. No.: WO02/082559

PCT Pub. Date: Oct. 17, 2002

(65) Prior Publication Data

US 2004/0155739 A1    Aug. 12, 2004

(30) Foreign Application Priority Data

Apr. 6, 2001    (DE) ................ 101 17 370

(51) Int. Cl.
*H01F 6/00*    (2006.01)
(52) U.S. Cl. ........................ 335/216; 335/296
(58) Field of Classification Search ......... 335/296–299, 335/216
See application file for complete search history.

(56) References Cited

U.S. PATENT DOCUMENTS

| | | | | |
|---|---|---|---|---|
| 4,808,488 A | * | 2/1989 | Chevrel et al. | 428/614 |
| 5,122,507 A | * | 6/1992 | Yamamoto et al. | 505/231 |
| 5,138,383 A | * | 8/1992 | Shiga et al. | 335/216 |
| 6,020,803 A | | 2/2000 | Wheatley et al. | |
| 6,603,379 B1 | * | 8/2003 | Manlief et al. | 335/216 |
| 6,784,362 B1 | * | 8/2004 | Buczek et al. | 174/15.4 |
| 2004/0162223 A1 | * | 8/2004 | Walter et al. | 505/230 |

FOREIGN PATENT DOCUMENTS

| | | |
|---|---|---|
| JP | 6-163248 | 6/1994 |
| WO | WO99/48159 | 9/1999 |

OTHER PUBLICATIONS

Abstract of Japanese Patent Publication No. 01215074 (Aug. 29, 1989).
T. Onishi, et al., "Improvement of stabilized current density in superconducting composite conductor," *Advances in Superconductivity XI. Proceedings of the 11th International Symposium on Superconductivity* (ISS '98), vol. 2, pp. 1381-1384, Nov. 16-19, 1998.

(Continued)

*Primary Examiner*—Elvin Enad
*Assistant Examiner*—Bernard Rojas
(74) *Attorney, Agent, or Firm*—Dean W. Russell; Kristin M. Crall; Kilpatrick Stockton LLP

(57) ABSTRACT

The invention relates to a superconductor assembly comprising a metallic superconductor and a ceramic superconductor, which are mechanically and electrically interconnected to form a one-piece hybrid superconductor.

12 Claims, 2 Drawing Sheets

OTHER PUBLICATIONS

Figure 1:
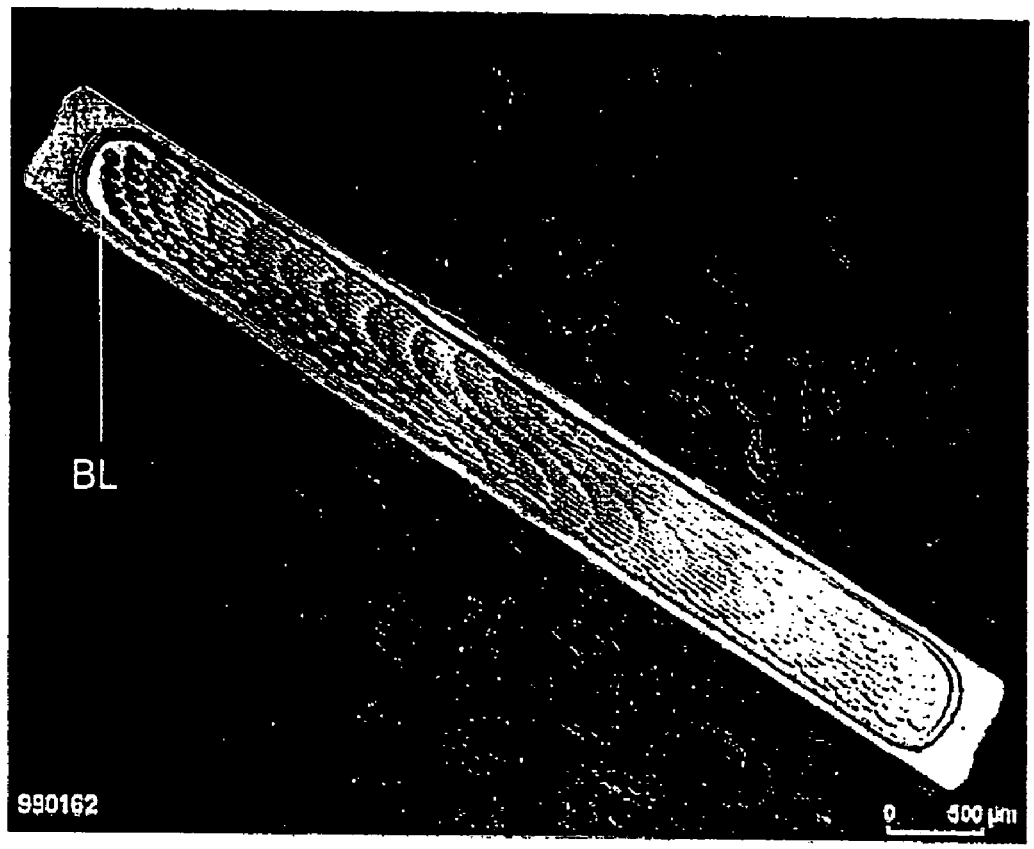

M. Apperley, et al., "Properties of Ag-Mg alloy sheather Bi-2223 tapes," *Cryogenics*, Bd. 40, No. 4-5, pp. 319-324, Apr. 2000.
Patent Abstracts of Japan, vol. 1995, No. 03, Apr. 28, 1995 and JP 06 349628, Dec. 22, 1994.
Patent Abstracts of Japan, vol. 018, No. 681, Dec. 21, 1994, and JP 06 275146, Sep. 30, 1994.
International Search Report in related Application No. PCT/EP02/03031.
Abstract of Japanese Patent Publication No. JP61231778 (Oct. 16, 1986).
Abstract of Japanese Patent Publication No. JP3038890 (Feb. 19, 1991).

* cited by examiner

SUPERCONDUCTOR ASSEMBLY

CROSS REFERENCE TO RELATED APPLICATIONS

This application is the U.S. national phase of International Application No. PCT/EP02/03031 filed on Mar. 19, 2002, which claims priority to German Patent Application No. 101 17 370.9 filed on Apr. 6, 2001, the contents of which are hereby incorporated by reference.

The present invention relates to a superconductor assembly.

The significance of superconductors continually increases, since conductors capable of carrying high currents even in high magnetic fields are desired in more and more applications. In this case, metallic conductors, such as the superconductor of the type NSTT62000, distributed by Vacuumschmelze, or ceramic superconductors (also called high-temperature superconductors), such as the superconductor of the type Bi-2223HTSL 121-2.3/-AgAgMg, distributed by Vacuumschmelze, are known.

Due to their low intrinsic specific upper critical magnetic field, the metallic superconductors are not capable of still carrying technically adequate high currents in greater magnetic fields. Due to their upper critical magnetic field, which is much larger than the current permanently accessible magnetic fields, ceramic superconductors have no restriction of this type. The value of the critical current is nearly independent of the external magnetic field above 20 T, for example. However, the ceramic superconductors react more sensitively to mechanical stresses, which are produced in magnets due to the Lorentz force, for example. For these reasons, magnetic systems are frequently segmented into an inner high field segment and an outer segment. In this case, ceramic superconductors are used for the inner high field segment, while metallic superconductors are used for the outer segments. It is problematic in this case to produce a robust, low-loss contact between the individual segments and therefore between metallic superconductors and ceramic superconductors.

The object of the present invention is therefore to specify a superconductor assembly which does not have these disadvantages.

This object is achieved by a superconductor assembly according to claim 1. Embodiments and refinements of the idea according to the present invention are the object of the subclaims.

The advantage of the present invention is that the "monolithic" superconductor assembled from a metallic superconductor and a ceramic superconductor exploits the mechanical properties and the current carrying capacity of the metallic superconductor in the event of low magnetic fields and additionally behaves like a ceramic superconductor in the event of higher magnetic fields.

This is achieved specifically by a superconductor assembly having a metallic superconductor and a ceramic superconductor, which are mechanically and electrically connected to one another to form a one-piece hybrid superconductor. This means that the two superconductors (particularly composite superconductors) are connected to one another not only at the ends, but are mechanically and electrically connected to one another punctually or continuously over the entire superconductor length.

In this case, the two superconductors are preferably connected to one another using low-temperature solder. For specific applications, connection using hard solder, conductive plastic (particularly adhesive), or mechanical connection elements (such as clamps, shaped elements, suitable profiles, and special shaping of the superconductors, etc.) is also possible.

Furthermore, at least one of the two superconductors is preferably provided with a rectangular cross-section and particularly implemented as a strip. Through the rectangular cross-section of the conductors (which is tailored as much as possible), a larger contact surface is provided. This leads to greater mechanical strength of the connection and to a lower electrical resistance.

For numerous applications of superconductors, they are wound around a core or a carrier, for example. Therefore, the wound superconductors are curved. In a refinement of the present invention, for a curved superconductor assembly according to the present invention, the metallic superconductor has a larger radius of curvature and the ceramic superconductor has a smaller radius of curvature.

With sufficient mechanical strength of the (soldered) connection, a reversal of the positions of the metallic and the ceramic superconductors is also possible in this case: ceramic superconductor at a larger radius of curvature and metallic superconductor at a smaller radius of curvature. In addition, there is also the possibility of positioning the two superconductors next to one another.

An A15 compound is provided as the preferred metallic superconductor. A quaternary, externally stabilized NbSn superconductor may be provided as this type of superconductor, which may contain 20%–40% copper (particularly 22%–24% copper). The NbSn superconductor may also be replaced by other metallic high magnetic field conductors, such as NbAl superconductors.

Preferably, $(Bi, Pb)_2Sr_2Ca_2Cu_3O_x$ superconductors are provided as the ceramic superconductor. These superconducting metal oxide compounds have high transition temperatures of at least 77K, because of which these compounds are also referred to as high-temperature superconductor materials and allow cooling by liquid nitrogen. These metal oxide compounds particularly include cuprates based on the bismuth material system Bi—Sr—Ca—Cu—O, individual components of this material system able to be at least partially replaced by others.

In particular, a corresponding partial substitution of the Bi component by Pb is possible. Within these Bi-containing material systems, at least two superconducting phases arise, which differ in the number of copper-oxygen network planes (layers) within their crystalline unit cells. However, in general, use of all ceramic high-temperature superconductors is conceivable, such as:

$(La, Ba)_2CuO_4$;
$(Nd, Ce)_2CuO_x$;
$(Nd, Sr, Ce)_2CuO_4$;
$HgBa_2CuO_x$;
$(Pb, Cu) (Eu, Ce)_2(Sr, Eu)_2Cu_2O_9$;
$(Eu, Ce)_2(Ba, Eu)_2Cu_3O_x$;
$(Tl, Pb) Sr_4Cu_2CO_3O_7$;
$Tl_2Ba_2CuO_6$;
$Bi_2Sr_2 (Gd, Ce)_2Cu_2O_{10}$;
$Pb_2(Sr, La)_2Cu_2O_6$;
$(La, Sr, Ca)_3Cu_2O_6$;
$TlBa_2CaCu_2O_x$;
$YBa_2Cu_3O_x$;
$Tl_2Ba_2CaCu_2O_8$;
$YBa_2Cu_4O_8$;
$Y_2Ba_4Cu_7O_{15}$;
$Pb_2Sr_2YCu_3O_8$;
$PbBaYSrCu_3O_8$;
$TlBa_2Ca_2Cu_3O_x$;

$Tl_2Ba_2Ca_2Cu_3O_{10}$;
$(Sr, Ca)_5Cu_5O_{10}$;
$TlBa_2Ca_3Cu_4O_{11}$;
$Tl_2Ba_2Ca_3Cu_4O_{12}$;
$TlBa_2Ca_4Cu_5O_{13}$;
$Tl_2Ba_2Ca_4Cu_5O_{14}$;
$(Ba, Sr)CuO_2$.

Some elements may also be replaced by other metals (e.g.; Pb) for improved phase formation or the oxygen content may vary.

If multiple corresponding strip-shaped or wire-shaped high-temperature superconductors or their conductor intermediate products or conductor precursors are bundled in a way known per se, conductors having multiple superconducting conductor cores, multicore or multifilament conductors, may also be obtained. These elements are embedded in a matrix which, in a refinement of the present invention, is preferably made of silver. At the same time, the matrix may be enclosed by a dispersion-hardened silver-magnesium envelope. This envelope provides the multifilament conductor with improvement of its mechanical properties in relation to a pure silver envelope. The characteristic values of tensile stress and extension and radius of curvature for degradation of the critical current are elevated in this case.

For metallic superconductors, the types NSTxxxxx (xxxxx is the variable filament count between 00001 and 64000, for example), distributed by VAC, may alternatively be used. For the ceramic superconductors, the types having 37, 55, 81, 121, or more filaments, distributed by Vacuumschmelze, may alternatively be used, for example. As a matrix, an Ag alloy may also be used instead of pure silver (e.g.; $AgPd_x$ or $AgAu_x$). An AgMn alloy or an AgMgNi alloy may alternatively be used as an envelope, for example.

The present invention is described in the following in greater detail on the basis of the exemplary embodiments illustrated in the figures of the drawing.

Figure 2:
Figure 3:
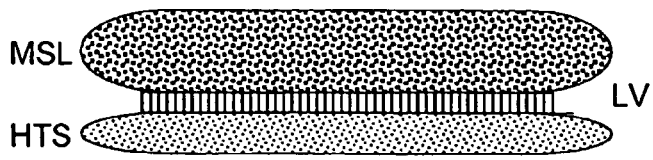
Figure 4:
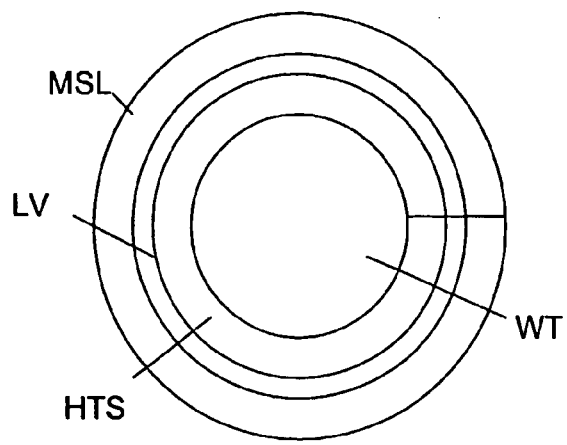
Figure 5:
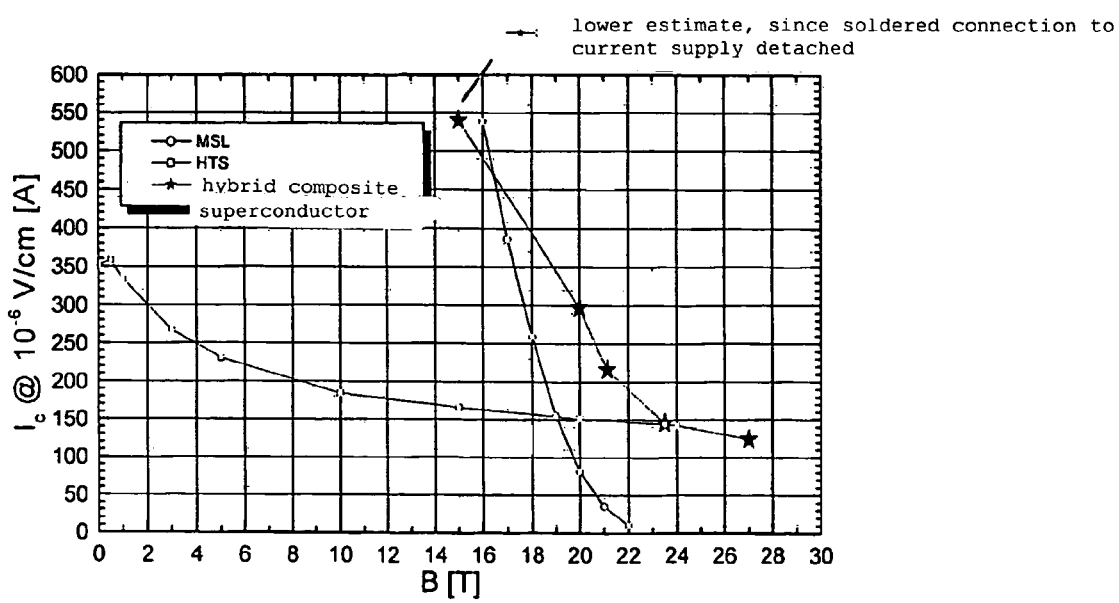

FIG. 1 shows an exemplary embodiment of a metallic superconductor for use in a superconductor assembly according to the present invention, FIG. 2 shows an embodiment of a ceramic superconductor for use in a superconductor assembly according to the present invention, FIG. 3 schematically shows the construction of a superconductor assembly according to the present invention in cross-section, FIG. 4 shows an exemplary embodiment of a preferred embodiment of a superconductor assembly according to the present invention in a side view, and FIG. 5 shows the graph of the current carrying capacity for a single metallic superconductor, a ceramic superconductor, and a superconductor assembly according to the present invention in comparison.

FIG. 1 shows a cross-section of a conventional, technical, metallic superconductor of the type NSTT62000A23, distributed by Vacuumschmelze. This composite superconductor represents a quaternary, externally stabilized bronze conductor BL having 23% copper, whose construction, together with the heat treatment used during manufacture, is optimized for high field usage.

FIG. 2 shows a cross-section of a ceramic superconductor (high-temperature superconductor) of the type Bi-2223 HTSL 121-2.3/-AgAgMg, distributed by Vacuumschmelze. This superconductor contains a reacted high-temperature superconductor cuprate of the type Bi-2223 in 121 filaments FL. Specifically, $Bi_2Sr_2Ca_2Cu_3O_x$ is used as the cuprate, bismuth able to be partially replaced by lead. These filaments FL are embedded in a matrix AG made of silver, which is in turn enclosed by a dispersion-hardened silver-magnesium envelope HL. Such a ceramic composite superconductor has, for example, a critical current Ic=55–80 A at a temperature of T=77K, and an electrical field $E_c$=1 μV/cm in the intrinsic magnetic field.

As shown in FIG. 3, according to the present invention, a metallic superconductor MSL, such as that shown in FIG. 1, and a ceramic superconductor HTS, such as that shown in FIG. 2, are mechanically and electrically connected to one another via a solder connection LV. For example, low melting point, commercially obtainable solder of the type ELSOLD soft solder S—Bi50, Pb25Sn12, 5Cd12.5, or α-Grillo solder tin Ni49In21Pb18Sn12, or Fusion Solder Paste SSX-430-830, among others, may be used as the solder.

To solder the two superconductors MSL and HTS, the solder LV is applied as a paste between the two layers, for example, and the entire assembly is subsequently appropriately heated. Another possibility is to pour a liquid solder LV between the heated superconductors MSL and HTSL. Hard soldering using a NiCoSn film is also possible.

A winding produced using a superconductor assembly according to the present invention is shown in a side view in FIG. 4. The winding is applied to a winding carrier WT in this case. Winding carrier WT and the superconductor arrangement are essentially round, so that the superconductor arrangement has a corresponding curvature. In this case, the ceramic superconductor HTS is positioned closer to the carrier WT than the metallic superconductor MSL, for example.

In FIG. 5, the current carrying capacity of a single metallic superconductor MSL, a ceramic superconductor HTSL, and a hybrid composite superconductor according to the present invention are shown in comparison. The graph of the ceramic superconductor HTS starts out falling steeply from high current densities $I_c$ (in A) and small magnetic fluxes B (in T) in this case and then passes in a flatter curve to smaller current densities. In contrast, the graph of the metallic superconductor MSL begins at moderate magnetic fluxes B and high current densities and practically approaches zero at high magnetic fluxes B, the curve being essentially steep.

It may be seen from this that the metallic superconductors MSL are not still capable of carrying technically adequate high currents in larger magnetic field. The ceramic superconductors HTS, in contrast, have no restriction of this type. The value of the critical current for ceramic superconductors is nearly independent of the external magnetic field above 20 T, for example. However, the ceramic superconductors react more sensitively to mechanical strains, which may be produced in magnet end axes and through the Lorentz force, for example.

The present invention reduces these problems significantly, in that it connects metallic superconductors MSL and ceramic superconductors HTS into a monolithic conductor in such a way that the current carrying capacity of the metallic superconductor MSL is exploited in low magnetic fields and the current carrying capacity of the ceramic superconductor HTS is then used in higher magnetic fields.

A further advantage in this case is that the maximum of the force strain (Lorentz force) now no longer arises in the highest fields (>20 T), but rather at approximately 15 T. As may be seen from FIG. 5, the Ic(B) curve for the hybrid composite superconductor is shaped in such a way that it does not approach zero in stronger magnetic fields, but rather turns into the curve of the ceramic superconductors HTS at larger currents.

The invention claimed is:

1. A superconductor assembly comprising a metallic superconductor and a ceramic superconductor, which are mechanically and electrically connected to one another using low-temperature solder to produce a one-piece hybrid superconductor, wherein a $(Bi, Pb)_2Sr_2Ca_2Cu_3O_x$ superconductor is provided as the ceramic superconductor, and wherein at least one of the superconductors has a rectangular cross-section.

2. The superconductor assembly according to claim 1, wherein an A15 compound is provided as the metallic superconductor.

3. The superconductor assembly according to claim 1, wherein the ceramic superconductor has multiple filaments which are embedded in a matrix made of silver.

4. The superconductor assembly according to claim 1, wherein the metallic conductor contains 20 to 40 percent copper.

5. The superconductor assembly according to claim 4, wherein a quaternary, externally stabilized bronze conductor is provided as the metallic superconductor.

6. The superconductor assembly according to claim 1, where both superconductors are provided with a rectangular cross section and wherein longer edges of each of the rectangular cross sections are about equal.

7. A superconductor assembly comprising a metallic superconductor and a ceramic superconductor, which are mechanically and electrically connected to one another using low-temperature solder to produce a one-piece hybrid superconductor, wherein a $(Bi, Pb)_2Sr_2Ca_2Cu_3O_x$ superconductor is provided as the ceramic superconductor, and wherein the two superconductors connected to one another are curved, the metallic superconductor having a greater radius of curvature than the ceramic superconductor or vice versa.

8. The superconductor assembly according to claim 7, wherein an A15 compound is provided as the metallic superconductor.

9. The superconductor assembly according to claim 7, wherein the ceramic superconductor has multiple filaments which are embedded in a matrix made of silver.

10. The superconductor assembly according to claim 7, wherein the metallic conductor contains 20 to 40 percent copper.

11. The superconductor assembly according to claim 10, wherein a quaternary, externally stabilized bronze conductor is provided as the metallic superconductor.

12. A superconductor assembly comprising (i) a metallic superconductor and (ii) a $(Bi, Pb)_2Sr_2Ca_2Cu_3O_x$ ceramic superconductor having multiple filaments embedded in a silver matrix enclosed by a dispersion-hardened silver-magnesium envelope.

* * * * *